United States Patent
Wang et al.

(10) Patent No.: US 10,637,458 B1
(45) Date of Patent: Apr. 28, 2020

(54) SERIES-CONNECTED SIC MOSFET DRIVE CIRCUIT BASED ON MULTI-WINDING TRANSFORMER COUPLING

(71) Applicant: Harbin Institute of Technology, Harbin (CN)

(72) Inventors: Wei Wang, Harbin (CN); Panbao Wang, Harbin (CN); Gaolin Wang, Harbin (CN); Guihua Liu, Harbin (CN); Sibao Ding, Harbin (CN); Yijie Wang, Harbin (CN); Dianguo Xu, Harbin (CN)

(73) Assignee: HARBIN INSTITUTE OF TECHNOLOGY, Harbin, Heilongjiang (CN)

( * ) Notice: Subject to any disclaimer, the term of this patent is extended or adjusted under 35 U.S.C. 154(b) by 0 days.

(21) Appl. No.: 16/597,037

(22) Filed: Oct. 9, 2019

(30) Foreign Application Priority Data

Aug. 26, 2019 (CN) .......................... 2019 1 0790131

(51) Int. Cl.
*H03K 17/10* (2006.01)
*H03K 17/06* (2006.01)
*H01L 29/16* (2006.01)

(52) U.S. Cl.
CPC ......... *H03K 17/102* (2013.01); *H03K 17/063* (2013.01); *H01L 29/1608* (2013.01)

(58) Field of Classification Search
CPC . H03K 17/102; H03K 17/063; H01L 29/1608

USPC .... 327/108–112, 427, 434, 437; 326/82, 83, 326/87
See application file for complete search history.

(56) References Cited

U.S. PATENT DOCUMENTS

| | | | | |
|---|---|---|---|---|
| 6,836,161 B2* | 12/2004 | Akiyama | ........... | H03K 17/0406 327/108 |
| 7,236,041 B2* | 6/2007 | Kim | ........................ | H02M 1/08 327/110 |
| 8,680,837 B2* | 3/2014 | Zeng | .................... | H03K 17/691 323/289 |
| 2014/0191784 A1* | 7/2014 | Hatanaka | ............ | H01L 27/0629 327/109 |
| 2015/0124507 A1* | 5/2015 | Ridder | ............. | H03K 17/04123 363/127 |

(Continued)

*Primary Examiner* — Tomi Skibinski
(74) *Attorney, Agent, or Firm* — IPro, PLLC

(57) ABSTRACT

The present disclosure provides a series-connected SiC MOSFET drive circuit based on multi-winding transformer coupling. The drive circuit is mainly composed of a transformer, an energy storage capacitor and a push-pull circuit. The transformer plays a role of constraining a relationship between gate-source voltages of series-connected SiC MOSFETs to ensure that a drive voltage of each SiC MOSET in series is synchronously increased and decreased, and to prevent the problem of a dynamic voltage imbalance at moments of conduction and cutoff due to the desynchrony of the drive voltages. Both the energy storage capacitor and the push-pull structure are used to ensure that the SiC MOSFETs have sufficient drive currents at the moment of conduction to achieve fast conduction of the SiC MOSFETs. Meanwhile, a discharge loop is constructed for the gate-source voltages at the moment of cutoff to ensure that the drive voltages drop in a short period of time.

2 Claims, 8 Drawing Sheets

(56) References Cited

U.S. PATENT DOCUMENTS

2015/0330195 A1* 11/2015 Dong .................. E21B 43/128
                                                                     307/31

* cited by examiner

US 10,637,458 B1

SERIES-CONNECTED SIC MOSFET DRIVE CIRCUIT BASED ON MULTI-WINDING TRANSFORMER COUPLING

TECHNICAL FIELD

The present disclosure belongs to the technical field of drive circuits, and more particularly relates to a series-connected SiC MOSFET (silicon carbide metal oxide semiconductor field effect transistor) drive circuit based on multi-winding transformer coupling.

BACKGROUND ART

A SiC MOSFET, as a third-generation power electronic semiconductor device, has a higher operating frequency, a better blocking characteristic and a higher voltage-withstanding rating than a traditional Si IGBT (silicon insulated gate bipolar translator), but on some medium and high voltage occasions, the voltage-withstanding rating of a single SiC MOSFET is still unable to meet the requirements, so that a plurality of SiC MOSFETs need to be connected in series for application. The series-connected SiC MOSFETs involve a potential difference in drive sources between individuals, so that a plurality of drive power supplies is required to supply power. In addition, a characteristic difference between parasitic parameters of the individual SiC MOSFETs and a drive chip will lead to a delay of drive signals of the series-connected SiC MOFETs, which causes a delay between series-connected drive signals of the series-connected SiC MOSFETs and then results in a dynamically equalized voltage imbalance of the series-connected SiC MOSFETs, thereby causing a voltage sharing imbalance of the SiC MOSFETs at the moments of conduction and cutoff. Therefore, it is very necessary to design a related series-connected SiC MOSFET drive circuit to guarantee synchronism of the drive signals.

The traditional series-connected SiC MOSFETs need to perform drive power supply clamping by a bootstrap capacitor under a single drive power supply to realize conduction of the series-connected SiC MOSFETs. Current main series connection modes for the SiC MOSFETs include: (1) a stray capacitor bootstrap mode: drive voltage conditions are realized by means of charging a bootstrap capacitor based on the bootstrap capacitor of an SiC MOSFET; (2) an RC gate charging mode: a gate RC circuit is charged by an RC buffer circuit, thereby raising a gate voltage and then realizing the conduction of the series-connected SiC MOSFETs; and (3) a dynamic voltage buffer mode: a source potential of the series-connected SiC MOSFETs is pulled down through the conduction of lower SiC MOSFET in series connection via an RCD (residual current device) buffer circuit and a gate clamping diode, so as to reach stabilizing conditions of a gate-source voltage parallel-connected stabilizing tube and guarantee the conduction of the series-connected SiC MOSFETs. However, in the above three modes, the series-connected SiC MOSFETs need to withstand a voltage of a high-voltage bus, respectively, in a short period of time when conducted in sequence. Furthermore, if a gate-source resistive capacitor is involved, the application voltage thereof needs to be considered, so as to adapt to a high voltage caused by source potential suspension in a series-connected structure.

SUMMARY OF THE INVENTION

The objective of the present disclosure is to provide a series-connected SiC MOSFET drive circuit based on multi-winding transformer coupling to solve the problems in the prior art.

The present disclosure is implemented by the following technical solution. The present disclosure provides a series-connected SiC MOSFET drive circuit based on multi-winding transformer coupled. The drive circuit includes a primary side circuit and at least two drive loops. A winding $N_1$ in the primary side circuit and a winding $N_i$ (i=2, 3, . . . , n, and n is a positive integer) in each drive loop form a multi-winding coupled transformer used to constrain series-connected drive voltages. The adjacent drive loops are connected in series through respective SiC MOSFETs. Each drive loop includes a winding $N_2$, a resistor $R_3$, a diode $D_2$, a diode $D_3$, a capacitor $C_2$, a resistor $R_4$, a triode $Q_1$, a triode $Q_2$ and a SiC MOSFET $M_1$. The dotted terminal of the winding $N_2$ is connected to one terminal of the resistor $R_3$, and the other terminal of the winding $N_2$ is connected to an anode of the diode $D_2$, one terminal of the capacitor $C_2$, one of the resistor $R_4$, the collector of the triode $Q_2$ and a source terminal of the SiC MOSFET $M_1$. The cathode of the diode $D_2$ is connected to the other terminal of the resistor $R_3$ and the anode of the diode $D_3$. The other terminal of the capacitor $C_2$ is connected to the cathode of diode $D_3$. The other terminal of the resistor $R_4$ is connected to the cathode of the diode $D_2$. The collector of the triode $Q_1$ is connected to the cathode of the diode $D_3$. The base of the triode $Q_1$ and the base of the triode $Q_2$ are respectively connected to the other terminal of the resistor $R_4$ and the cathode of the diode $D_2$. The emitter of the triode $Q_1$ is connected to the emitter of the triode $Q_2$. The gate terminal of the SiC MOSFET $M_1$ is connected to the emitter of the triode $Q_1$ and the emitter of the triode $Q_2$. The source terminal of the SiC MOSFET $M_1$ is connected to the drain of the SiC MOSFET $M_2$ in the adjacent drive loop. Each of the drive loops has the same structure.

Further, the primary side circuit includes a resistor $R_1$, a capacitor $C_1$, a diode $D_1$, a winding $N_1$, a Si MOSFET $S_1$ and a resistor $R_2$. The resistor $R_1$, the diode $D_1$ and the capacitor $C_1$ form an RCD buffer circuit. A dotted terminal of the winding $N_1$ is connected to the resistor $R_1$, the capacitor $C_1$ and the power supply $V_{CC}$. The other terminal of the resistor $R_1$ and the other terminal of the capacitor $C_1$ are connected to the cathode of the diode $D_1$. The anode of the diode $D_1$ and the other terminal of the winding $N_1$ are both connected to the drain of the Si MOSFET $S_1$. The source of the Si MOSFET $S_1$ is grounded. The gate of the Si MOSFET $S_1$ is connected to the terminal of the resistor $R_2$. The other terminal of the resistor $R_2$ is grounded.

The present disclosure has the beneficial effects that the drive circuit of the present disclosure is based on a multi-winding transformer. Drive voltages of the series-connected SiC MOSFETs are constrained through magnetic field coupling of a transformer to guarantee synchronism of the drive voltages of the series-connected SiC MOSFETs, thereby realizing synchronous conduction and cutoff of the series-connected SiC MOSFETs. In addition, the series-connected drive circuit provided can adjust the size of a discharge current loop of an RCD to determine duration of a drive negative voltage, thereby preventing a mis-conduction phenomenon of the series-connected SiC MOSFETs.

BRIEF DESCRIPTION OF THE DRAWINGS

FIG. 2A-2B is a schematic diagram of a current direction in a conduction process of a series-connected drive circuit, wherein FIG. 2A shows primary side current and FIG. 2B show secondary side current; wherein $i_1$ represents a current of a primary winding of a transformer, and $i_g$ represents a drive current of a SiC MOSFET;

FIG. 3A-3B is a schematic diagram of a current direction in a cutoff process of a series-connected drive circuit, wherein FIG. 3A shows primary side current and FIG. 3B show secondary side current; wherein $i_1$ represents a current of a primary winding of a transformer, $i_g$ represents a drive current of a SiC MOSFET, $i_2$ represents a current of a secondary winding of the transformer under a forward drive voltage, and $i_{c1}$ represents a current of a capacitor $C_1$ in a demagnetizing process;

FIG. 4A-4C is a schematic diagram of a drive simulation result under a single SiC MOSFET, wherein FIG. 4A shows overall simulation result, FIG. 4B shows waveform at the moment of conduction and FIG. 4C shows waveform at the moment of cutoff; wherein $U_{DS}$ represents a drain-source voltage of the SiC MOSFET, $U_{GS}$ represents a gate-source voltage of the SiC MOSFET, and the $V_{G\_logic}$ represents a drive signal of the SiC MOSFET;

FIG. 6A-6B is a schematic diagram of a simulation result of series-connected SiC MOSFETs under inconsistent parameters; wherein FIG. 6A shows waveform at the moment of conduction and FIG. 6B shows waveform at the moment of cutoff.

DETAILED DESCRIPTION OF THE INVENTION

The technical solution in the embodiments of the present disclosure will be clearly and completely described below in conjunction with the drawings in the embodiments of the present disclosure. It is apparent that the embodiments described are only a part of the embodiments of the present disclosure, but not all of the embodiments. All other embodiments obtained by those skilled in the art based on the embodiments of the present disclosure without creative efforts fall within the scope of protection of the present disclosure.

Figure 1:
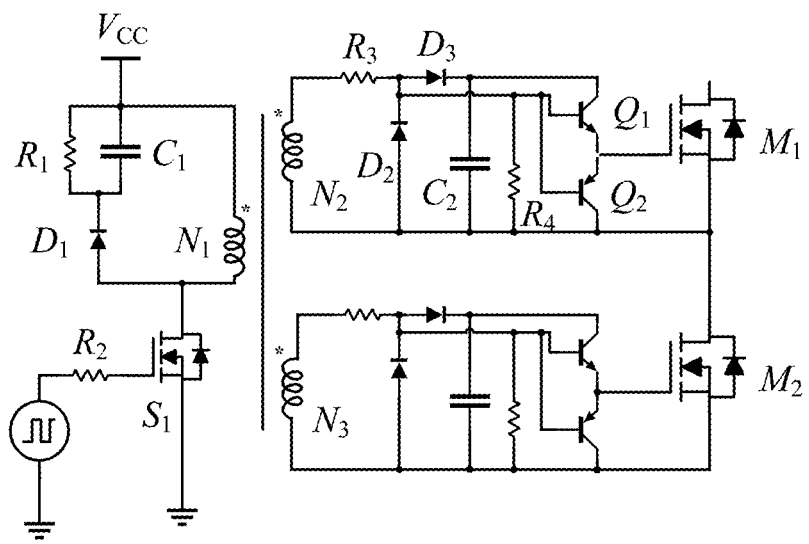
FIG. 1 is a structural diagram of a series-connected SiC MOSFET drive circuit based on multi-winding transformer coupling of the present disclosure.

The present disclosure provides a series-connected SiC MOSFET drive circuit based on multi-winding transformer coupled. The drive circuit includes a primary side circuit and at least two drive loops. A winding $N_1$ in the primary side circuit and a winding $N_i$ (i=2, 3, . . . , n, and n is a positive integer) in each drive loop form a multi-winding coupled transformer used to constrain series-connected drive voltages. The two adjacent drive loops are connected to the SiC MOSFETs in series connection respectively. Each drive loop includes a winding $N_2$, a resistor $R_3$, a diode $D_2$, a diode $D_3$, a capacitor $C_2$, a resistor $R_4$, a triode $Q_1$, a triode $Q_2$ and a SiC MOSFET $M_1$. A dotted terminal of the winding $N_2$ is connected to one terminal of the resistor $R_3$, and the other end of the winding $N_2$ is connected to an anode of the diode $D_2$, one end of the capacitor $C_2$, one terminal of the resistor $R_4$, the collector of the triode $Q_2$ and the source of the SiC MOSFET $M_1$. A cathode of the diode $D_2$ is connected to the other terminal of the resistor $R_3$ and an anode of the diode $D_3$. The other terminal of the capacitor $C_2$ is connected to a cathode of the diode $D_3$. The other terminal of the resistor $R_4$ is connected to the cathode of the diode $D_2$. The collector of the triode $Q_1$ is connected to the cathode of the diode $D_3$. The base of the triode $Q_1$ and The base of the triode $Q_2$ are respectively connected to the other terminal of the resistor $R_4$ and the cathode of the diode $D_2$. The emitter of the triode $Q_1$ is connected to the emitter of the triode $Q_2$. The gate of SiC MOSFET $M_1$ is connected to the emitter of the triode $Q_1$ and the emitter of the triode $Q_2$. The source of the SiC MOSFET $M_1$ is connected to the drain of the SiC MOSFET $M_2$ in the adjacent drive loop. Each of the drive loops has the same structure. When there are two drive loops, a specific circuit structure is as shown in FIG. 1.

The primary side circuit includes a resistor $R_1$, a capacitor $C_1$, a diode $D_1$, a winding $N_1$, a Si MOSFET $S_1$ and a resistor $R_2$. The resistor $R_1$, the diode $D_1$ and the capacitor $C_1$ form an RCD buffer circuit. A dotted terminal of the winding $N_1$ is connected to one terminal of the resistor $R_1$, the terminal of the capacitor $C_1$ and a power supply $V_{CC}$. The other terminal of the resistor $R_1$ and the other terminal of the capacitor $C_1$ are connected to a cathode of the diode $D_1$. The anode of the diode $D_1$ and the other terminal of the winding $N_1$ are both connected to the drain of the Si MOSFET $S_1$. The source of the Si MOSFET $S_1$ is grounded. The gate of the Si MOSFET $S_1$ is connected to one terminal of the resistor $R_2$. The other terminal of the resistor $R_2$ is grounded.

The present disclosure provides a drive circuit structure applicable to series-connected SiC MOSFETs. The structure realizes synchronism of drive voltages of the series-connected SiC MOSFETs based on magnetic field constraint of the multi-winding coupled transformer, and guarantees a dynamically equalized gate-source voltage of the series-connected SiC MOSFETs. The structure of the series-connected SiC MOSFET drive circuit based on multi-winding transformer coupled provided by the present disclosure is as shown in FIG. 1, wherein $M_1$ and $M_2$ represent two series-connected SiC MOSFETs; $N_1$, $N_2$ and $N_3$ form a multi-winding coupled transformer to constrain the series-connected drive voltage; $N_1$ serves as a primary side to provide a drive voltage and is combined with $S_1$ to convert the series-connected drive voltage into a power voltage signal to prevent attenuation caused by transformer transmission; $D_1$ and $C_1$ form the RCD buffer circuit to realize demagnetization in a drive cutoff process to ensure no magnetic saturation occurring in the transformer, thereby enabling the drive circuit to lose drive capacity; $R_2$ serves as a drive resistor for $S_1$ to limit a drive current; and a resistive device is connected into a high-frequency drive signal loop to suppress oscillation of the drive loops. The drive loop composed of $N_2$ and $N_3$ is symmetric. A backward stage of $N_2$ forms a drive circuit main body and is used for raising the drive current and controlling a drive voltage. $R_3$ serves as a discharge resistor and plays a demagnetizing role in the cutoff process. In addition, $R_3$ will limit the charging current of $C_2$. $D_2$ serves a demagnetizing loop free-wheeling diode; $D_3$ provides a loop for conducting the drive current; and $C_2$ serves as an energy storage capacitor of a forward voltage at the moment of driving, so as to provide a sufficient gate current to the SiC MOSFETs at the moment of conduction. $Q_1$ and $Q_2$ serve as backward-stage drive push-pull structure to raise the drive current. $R_4$ serves as a pull-down resistor and provides conduction and cutoff conditions for the conduction of $Q_1$ and $Q_2$.

Figures 2A, 2B:
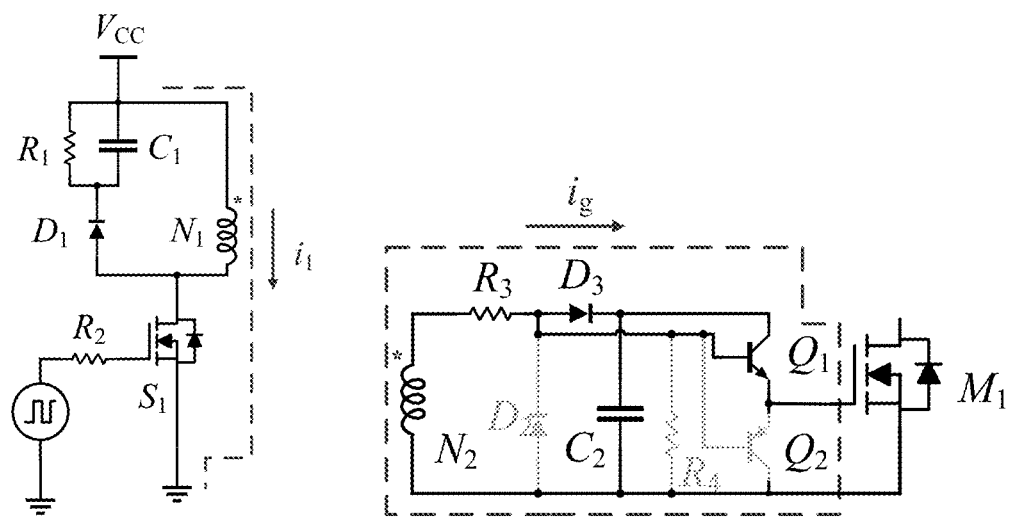

In order to guarantee the consistency of the drive signals of the series-connected SiC MOSFETs, the drive loops on a secondary side used actually are completely the same, so the analysis of each drive loop is completely same one of the drive loops is analyzed. In a specific conduction process, a direction of a transformer current $N_1$ and a direction of a drive current are as shown in FIG. 2A-2B. When a drive signal changes from a low level to a high level, the switch tube $S_1$ is conducted; at this time, the drive power supply $V_{CC}$ starts to charge $N_1$; the dotted terminals of the windings $N_1$ and $N_2$ are both positive; the diode $D_3$ is conducted, and the diode $D_2$ is cut off; $N_2$ is equivalent to a voltage source to output a voltage value close to $V_{CC}$ to start to charge $C_2$; the bases of $Q_1$ and $Q_2$ are positive voltages; $Q_1$ is conducted and $Q_2$ is cut off, and a gate charging current provides a loop; and when the gate-source drive voltages of the series-connected SiC MOSFETs start to rise synchronously, the SiC MOSFETs start to be conducted. Since the SiC MOSFET is a voltage-type device, the gate current is mainly caused by charging the gate-source capacitor $C_2$ and eliminating gate charges, and the current of $N_2$ may generate a relatively large current peak at the moment of conduction, and meanwhile, $C_2$ assists in voltage transformation to provide the drive current. After the SiC MOSFET is conducted, the drive voltages are maintained as positive without consuming a current, so that the currents of $N_2$ and $C_2$ are maintained at zero. During the conduction of the SiC MOSFET, the drive positive voltage is slightly less than VCC due to a voltage drop of the diode $D_3$.

Figure 3A:
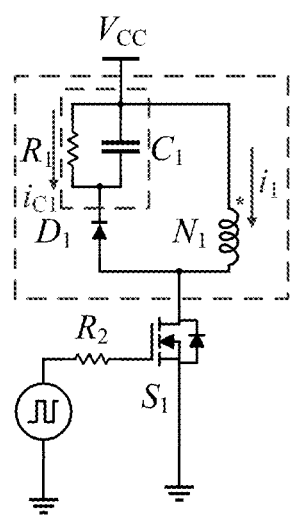
Figure 3B:
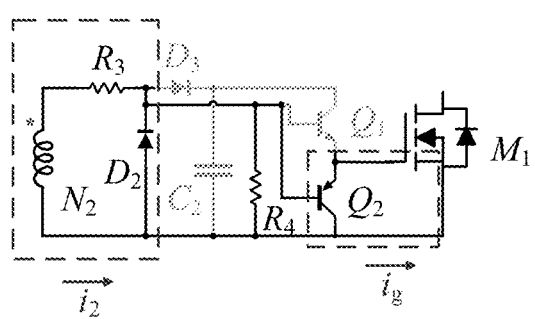

When the drive signal changes from a high level to a low level, the series-connected drive loops enter cutoff states. In a cutoff process, a current equivalence schematic diagram is as shown in FIG. 3A-3B. At this time, $S_1$ is cut off, and the primary winding $N_1$ may continuously maintain the current, but a dotted terminal of the transformer is equivalent to a negative voltage, and the current of $N_2$ is reversed, and $D_2$ is conducted, and $D_3$ is cut off, and the equivalent voltage of the dotted terminal of the transformer is reversed; therefore, a potential at two ends of the pull-down resistor $R_4$ is reversed, and then the levels of the bases of $Q_1$ and $Q_2$ are lower than the drive positive voltage; $Q_1$ is cut off, and $Q_2$ starts to be conducted; a drive gate current passes through $Q_2$ and starts to be discharged; and a drive gate-source voltage drops. Energy stored in $N_2$ is demagnetized through $D_2$ and $R_3$. Since the primary winding is also synchronously subjected to electric energy consumption through RCD absorption, the current of $N_2$ flows reversely in a short period of time during cutoff compared to the peak current at the conduction time, and becomes 0 as the demagnetization ends. Meanwhile, in this stage, since an RCD absorption circuit is added to demagnetize the transformer, after $S_1$ is cut off, $N_1$ charges $C_1$ through $D_1$, and $R_1$ consumes the energy stored by $N_1$, and the voltage of $C_1$ rises. At the maximum value, the voltage of $C_1$ plus the conduction voltage drop of $D_1$ is equal to the voltage of $N_1$, and resonance occurs between equivalent inductors of $C_1$ and $N_1$ until the energy stored by $N_1$ and $C_1$ is exhausted, and the voltage starts to drop, indicating that a demagnetization process ends.

Based on the above, when a plurality of SiC MOSFETs are connected in series, since the principles of the drive loops are the same, the drive voltages of the series-connected SiC MOSFETs are coupled by the transformer, so that sudden change of a single drive voltage can be suppressed, and a series dynamic voltage imbalance caused by desynchrony of the drive voltages is prevented.

Figure 4A:
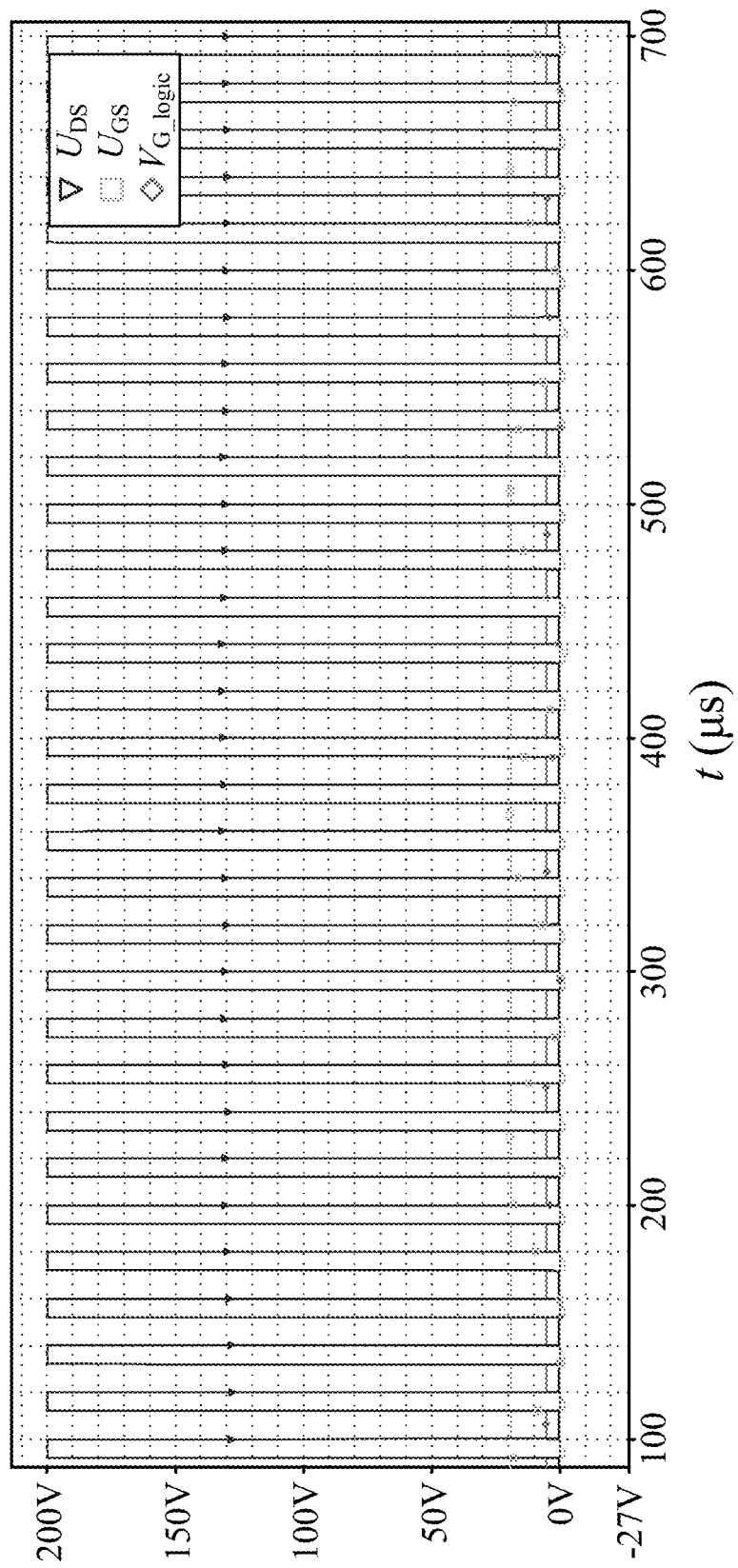
Figure 4B:
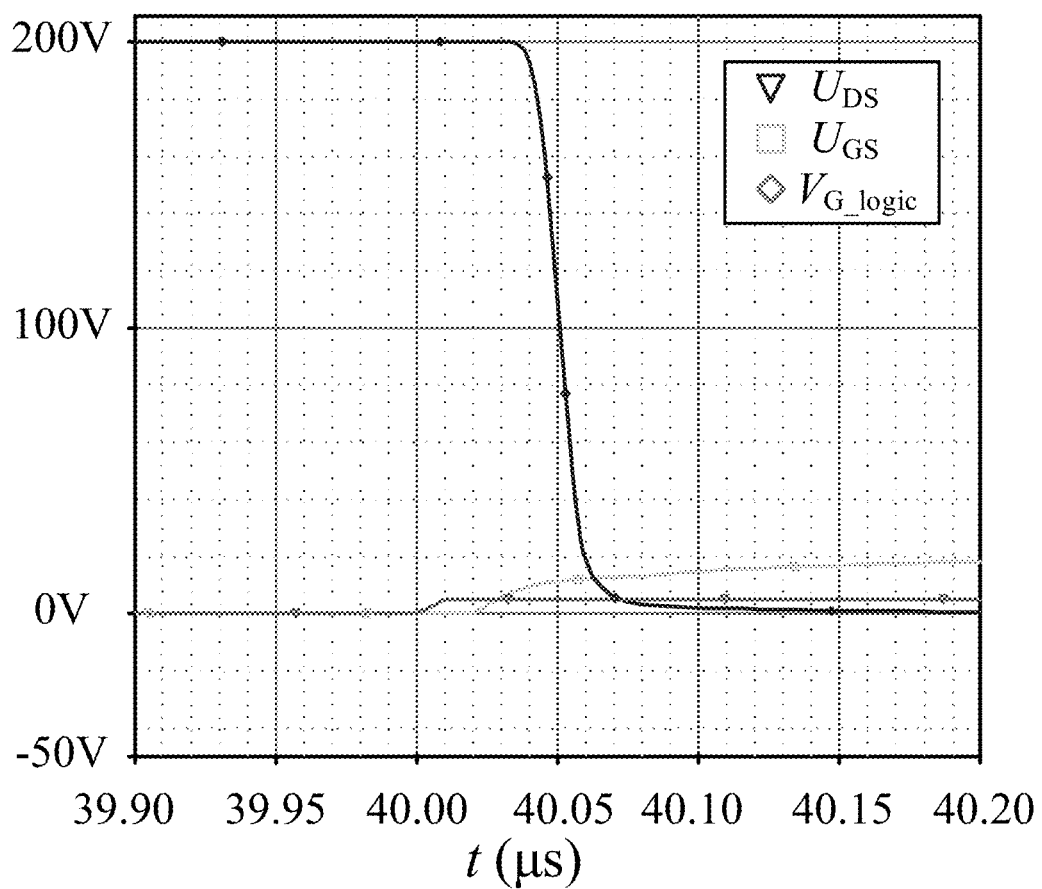
Figure 4C:
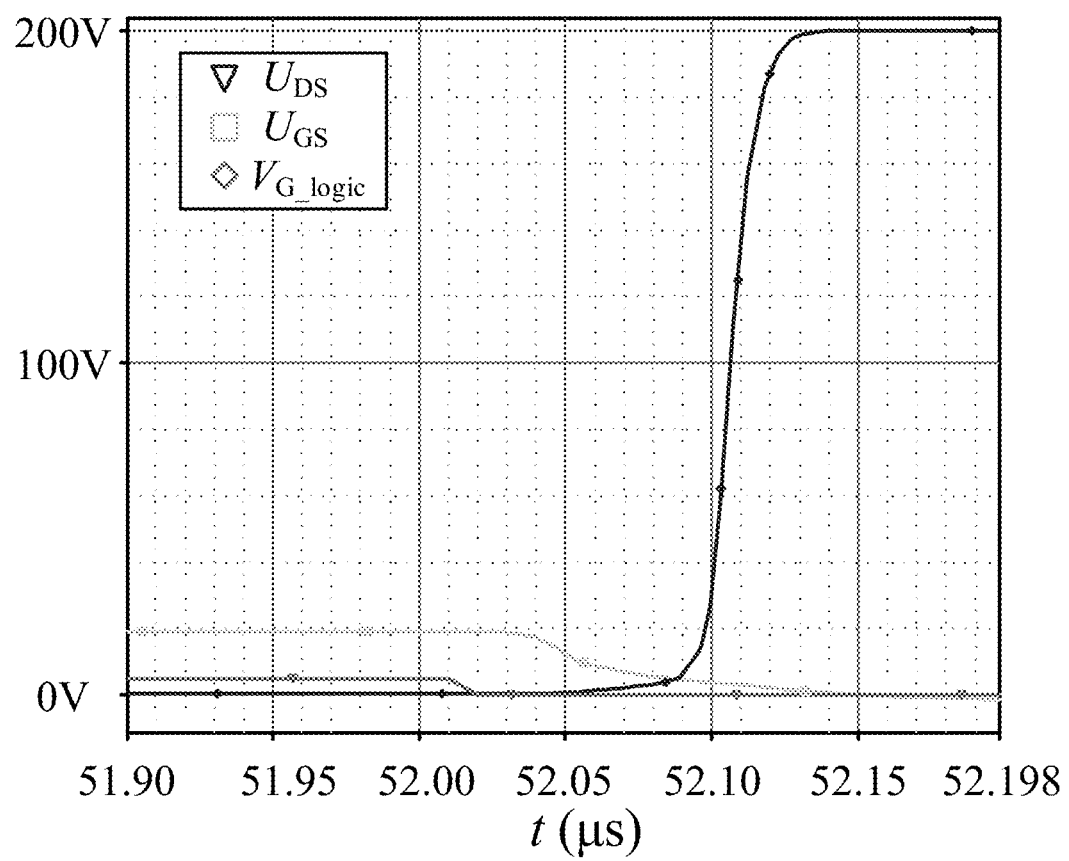

In order to further verify the feasibility of the transformer-isolated series-connected SiC MOSFET drive circuit provided by the present disclosure, a simulation model of a drive single tube of the transformer-isolated series-connected drive structure provided by the present disclosure is built in PSPICE software, and a SiC MOSFET model in a built drive model uses C3M0075120K of CREE. A primary side switch MOSFET uses SPB100N06S2L-05_L1 of Infineon, which has a withstand voltage of 55 V and can withstand a pulse current of 400 A. Firstly, the drive effect of a single SiC MOSFET is verified. An input drive signal is set to be a PWM (pulse width modulation) with 50 kHz and a duty cycle of 60 percent. A transformer ratio of the transformer in the model is 1:1, to reduce a reverse voltage of the primary winding in the demagnetization process of the transformer. A primary side input drive voltage is 20 V, and the drain-source voltage of the SiC MOSFET is 200 V. FIG. 4A shows waveforms of an output gate-source voltage and a drain-source voltage which are obtained by simulation. FIGS. 4(b) and 4(c) show partially enlarged views of a drive voltage and a drain-source voltage at the moments of conduction and cutoff. It can be seen that when a drive logic signal turns into a high level, there is a drive voltage of about 20 ns starting to turn to a high level, and the cutoff process is similar.

Figure 5:
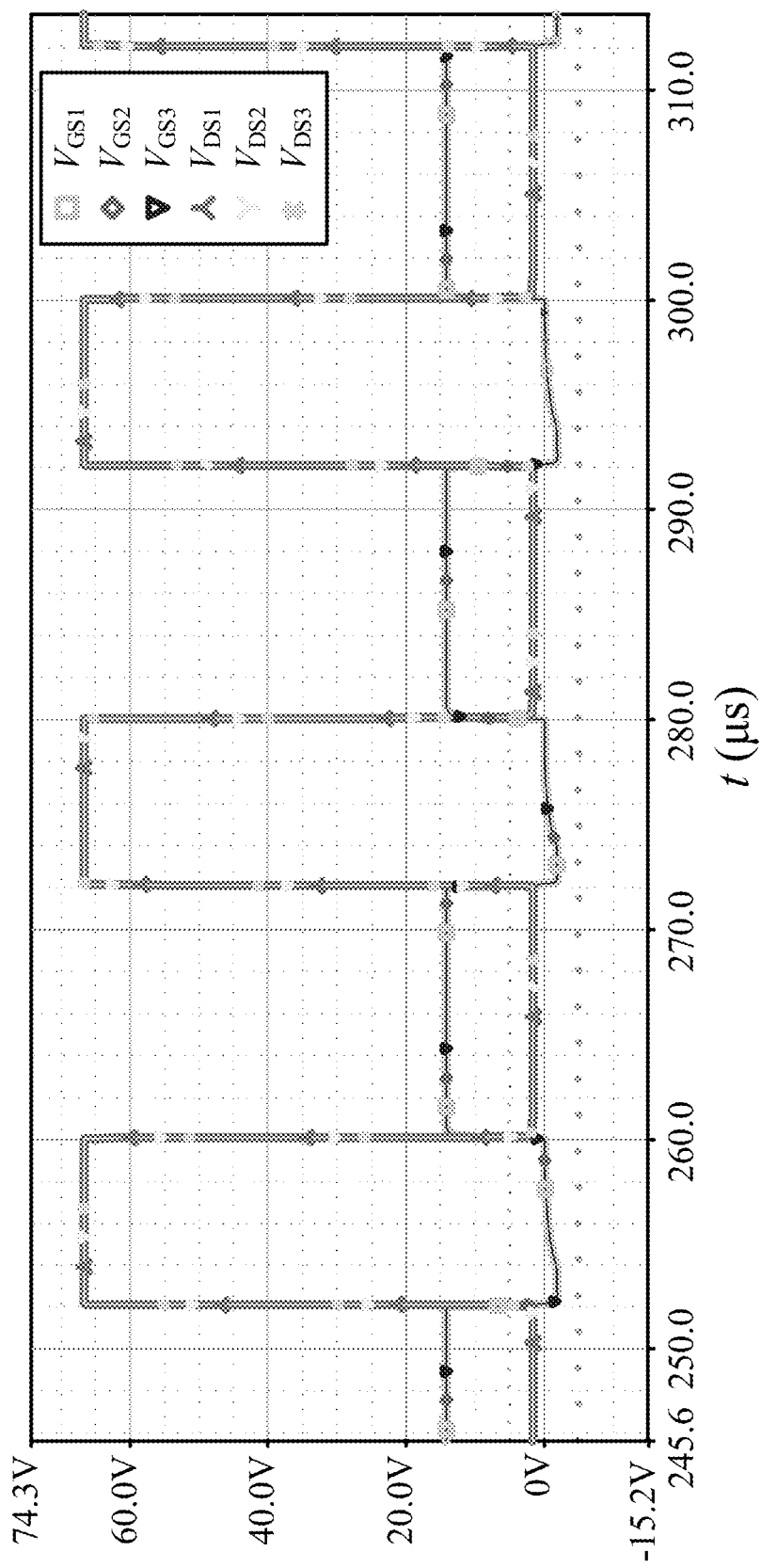
FIG. 5 is a drive simulation schematic diagram under three SiC MOSFETs that are connected in series, wherein $V_{GS}$ represents a gate-source voltage, and $V_{DS}$ represents a gate-source voltage.

In order to further verify the control effect of a driver with the series-connected SiC MOSFETs, the voltage of a drive voltage source is changed to 15 V under 200 V, and three identical SiC MOSFETs are connected in series for simulation. Simulation results obtained are as shown in FIG. 5. It can be seen from the results that when parameters of the drive loops on the secondary side of the series-connected driver are completely the same, each partial voltage of the series-connected SiC MOSFET is ⅓ of the drain-source voltage. Due to the coupling relationship of the transformer, conduction and cutoff are realized at the same time.

Figure 6A:
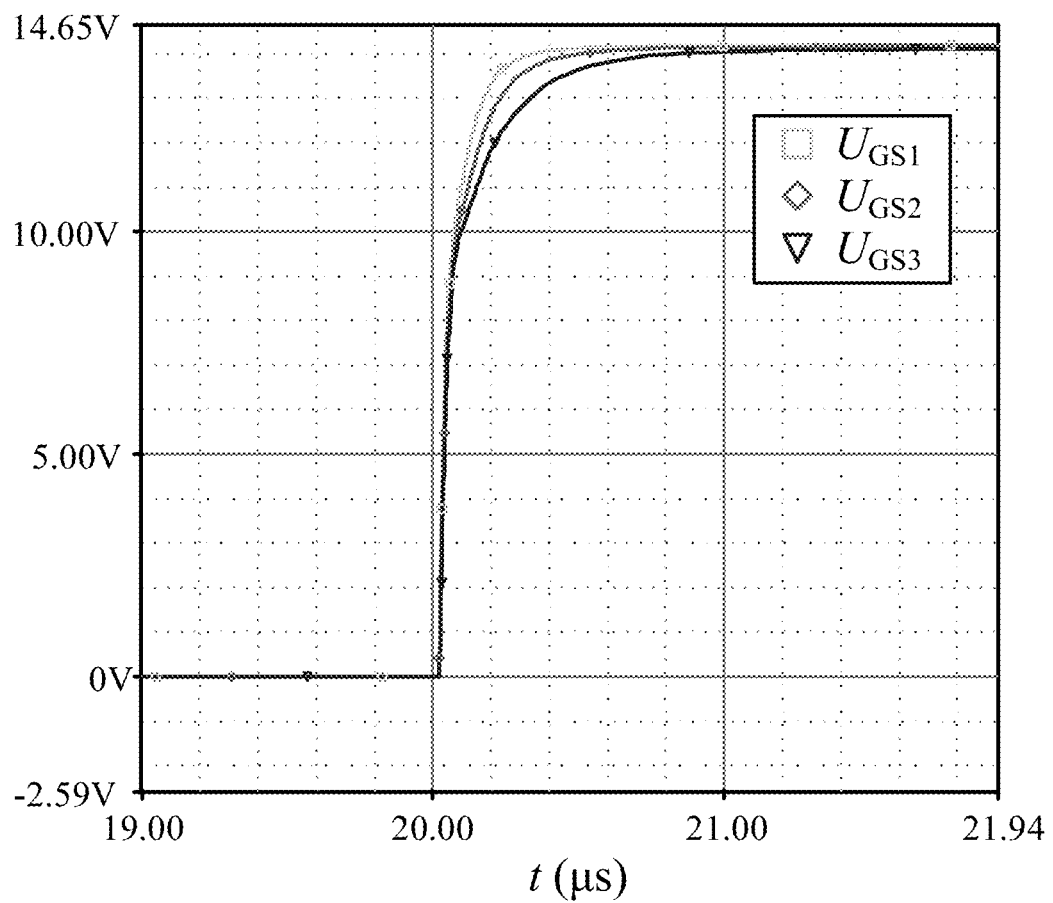
Figure 6B:
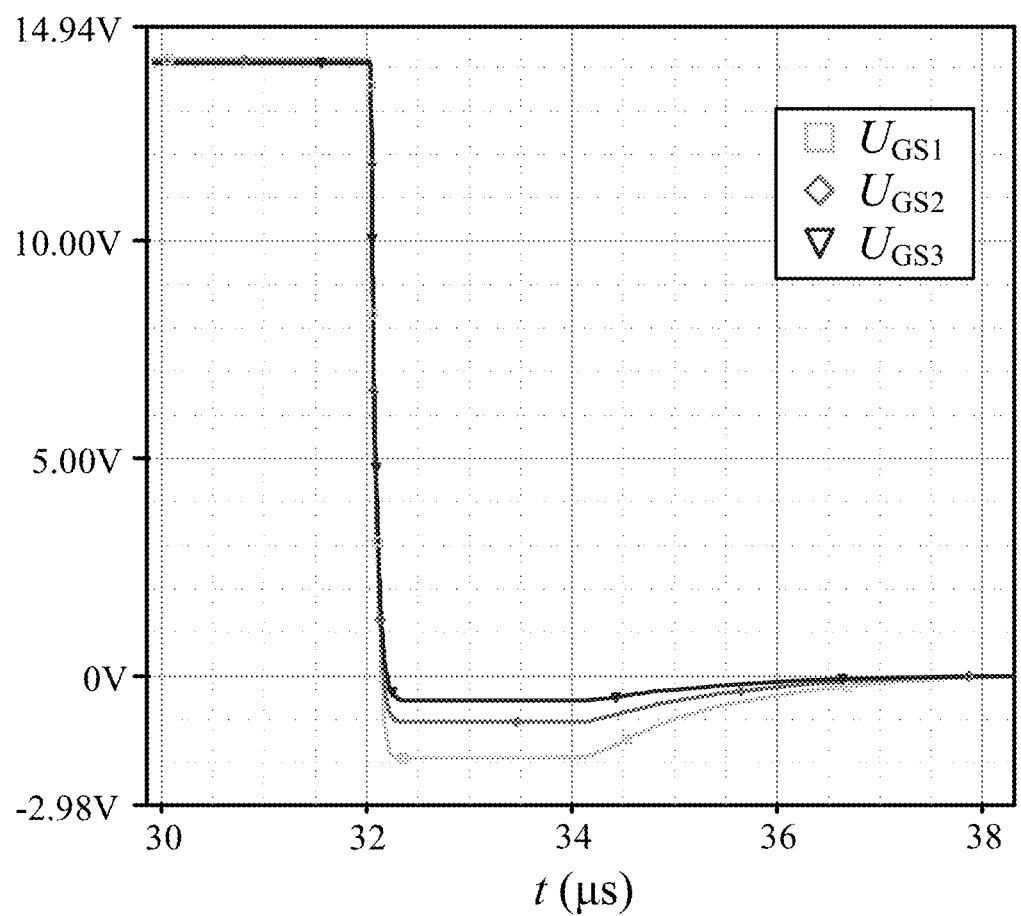

In order to explain the constraint of the series-connected drive circuit provided by the present disclosure to the synchronism of the drive voltages, the magnitudes of demagnetizing resistors on the secondary side of the transformer are changed for simulation verification. A simulation result is shown in FIG. 6A-6B. It can be seen from the simulation result that even if the magnitudes of the demagnetizing resistors on the secondary side of the transformer are different, the gate-source voltages of the three series-connected SiC MOSFETs at the moment of powering on are still raised synchronously, but since the demagnetizing resistors may limit the charging time of the energy storage capacitor at the moment of conduction, time points of reaching the maximum drive voltage values are different. At the moment of cutoff, due to the magnetic field constraint of the transformer, the discharge resistance of the drain-source voltage is inconsistent, which will cause a difference in the cutoff negative voltage, except that the discharge time points are the same. As long as there is residual energy in one transformer winding, other windings will generate a corresponding reverse induced electromotive force.

The drive circuit of the present disclosure is mainly composed of the transformer, the energy storage capacitor and the push-pull circuit. The transformer plays a role of constraining a relationship between the gate-source voltages of the series-connected SiC MOSFETs to ensure that the drive voltage of each SiC MOSFET in series is synchronously increased and decreased, and to prevent the problem of the dynamic voltage imbalance at the moments of conduction and cutoff due to the desynchrony of the drive voltages. Both the energy storage capacitor and the push-pull structure are used to ensure that the SiC MOSFETs have sufficient drive currents at the moment of conduction to achieve fast conduction of the SiC MOSFETs. Meanwhile, a discharge loop is constructed for the gate-source voltages at the moment of cutoff to ensure that the drive voltages drop in a short period of time.

The series-connected SiC MOSFET drive circuit based on multi-winding transformer coupling provided by the present disclosure is described in detail as above. The principles and implementation methods of the present disclosure are described by specific examples in the text. The description of the above embodiments is only used to help understand the method and core idea of the present disclosure. Meanwhile, for those skilled in the art, according to the idea of the present disclosure, there will be changes in the Detailed Description of the Invention and application scope. Based on the above, the content of the description shall not be construed as limiting the present disclosure.

The invention claimed is:

1. A series-connected SiC MOSFET drive circuit based on multi-winding transformer coupling, comprising a primary side circuit and at least two drive loops, wherein a winding $N_1$ in the primary side circuit and a winding $N_i$ in each drive loop form a multi-winding coupled transformer to constrain series-connected drive voltages, where i=2, 3, . . . , n, and n is a positive integer; two adjacent drive loops are connected in series through respective SiC MOSFETs; each drive loop comprises a winding $N_2$, a resistor $R_3$, a diode $D_2$, a diode $D_3$, a capacitor $C_2$, a resistor $R_4$, a triode $Q_1$, a triode $Q_2$ and a SiC MOSFET $M_1$; a dotted terminal of the winding $N_2$ is connected to the terminal of the resistor $R_3$, and the other terminal of the winding $N_2$ is connected to the anode of the diode $D_2$, one terminal of the capacitor $C_2$, one terminal of the resistor $R_4$, the collector of the triode $Q_2$ and the source of the SiC MOSFET $M_1$; the cathode of the diode $D_2$ is separately connected to the other terminal of the resistor $R_3$ and an anode of the diode $D_3$; the other terminal of the capacitor $C_2$ is connected to the cathode of the diode $D_3$; the other terminal of the resistor $R_4$ is connected to the cathode of the diode $D_2$; the collector of the triode $Q_1$ is connected to the cathode of the diode $D_3$; the base of the triode $Q_1$ and the base of the triode $Q_2$ are connected to the other terminal of the resistor $R_4$ and the cathode of the diode $D_2$, respectively; the emitter of the triode $Q_1$ is connected to the emitter of the triode $Q_2$; the gate of the SiC MOSFET $M_1$ is separately connected to the emitter of the triode $Q_1$ and the emitter of the triode $Q_2$; the source of the SiC MOSFET $M_1$ is connected to a drain of a SiC MOSFET $M_2$ in an adjacent drive loop; and each of the drive loops has a same structure.

2. The series-connected SiC MOSFET drive circuit according to claim 1, wherein the primary side circuit comprises a resistor $R_1$, a capacitor $C_1$, a diode $D_1$, a winding $N_1$ a Si MOSFET $S_1$ and a resistor $R_2$; the resistor $R_1$, the diode $D_1$ and the capacitor $C_1$ form an RCD buffer circuit; a dotted terminal of the winding $N_1$ is separately connected to one terminal of the resistor $R_1$, one terminal of the capacitor $C_1$ and a power supply $V_{CC}$; the other end of the resistor $R_1$ and the other terminal of the capacitor $C_1$ are both connected to the cathode of the diode $D_1$; the anode of the diode $D_1$ and the other terminal of the winding $N_1$ are both connected to the drain of the Si MOSFET $S_1$; the source of the Si MOSFET $S_1$ is grounded; the gate of the Si MOSFET $S_1$ is connected to one terminal of the resistor $R_2$; and the other terminal of the resistor $R_2$ is grounded.

* * * * *